United States Patent [19]

Urabe et al.

[11] Patent Number: 5,041,898
[45] Date of Patent: Aug. 20, 1991

[54] INTERCONNECTION LAYER FORMED ON EMBEDDED DIELECTRIC AND METHOD FOR MANUFACTURING THE SAME

[75] Inventors: Takashi Urabe; Yoichi Tobita, both of Hyogo, Japan

[73] Assignee: Mitsubishi Denki Kabushiki Kaisha, Tokyo, Japan

[21] Appl. No.: 231,064

[22] Filed: Aug. 11, 1988

[30] Foreign Application Priority Data

Sep. 8, 1987 [JP] Japan .............................. 62-225039

[51] Int. Cl.[5] ...................... H01L 29/34; H01L 21/44
[52] U.S. Cl. ........................................ 357/52; 357/55; 357/68; 437/67; 437/180
[58] Field of Search ...................... 357/52, 55, 86, 68; 437/67, 180

[56] References Cited

U.S. PATENT DOCUMENTS

| 4,502,913 | 3/1985 | Lechaton et al. | |
| 4,819,054 | 4/1989 | Kawaji et al. | 357/55 |
| 4,910,575 | 3/1990 | Komeda et al. | 357/55 |

FOREIGN PATENT DOCUMENTS

| 0036764 | 3/1981 | European Pat. Off. | |
| 0086915 | 11/1982 | European Pat. Off. | |

OTHER PUBLICATIONS

S. D. Malaviya, "Deep Dielectric Isolation", IBM Technical Disclosure Bulletin, vol. 26, No. 7A (Dec. 1983), pp. 388–389.

K. P. Thiel et al., "Polymide Nitride Isolation", IBM Technical Disclosure Bulletin, vol. 27, No. 7B (Dec. 1984), pp. 4139–4140.

K. Yamabe and K. Imai, "Nonplanar Oxidation and Reduction of Oxide Leakage Currents at Silicon Corners by Rounding-Off Oxidation", IEEE Transactions on Electron Devices, vol. ED-34, No. 8 (Aug. 1987), pp. 1681–1687.

Primary Examiner—Edward J. Wojciechowicz
Attorney, Agent, or Firm—Lowe, Price, LeBlanc and Becker

[57] ABSTRACT

Trenches (2) are formed in three rows in a major surface of a semiconductor substrate (1). The major surface of the semiconductor substrate (1) including the inside of the trenches (2) is thermally oxidized. A first oxide film (4) filling the trenches is formed by thermal oxidation, a second oxide film (4) is formed in a region of the semiconductor substrate interposed between the trenches, and a third oxide film (3) is formed on the major surface of the semiconductor substrate excluding the region interposed between the trenches. The upper surfaces of the first, second and third oxide films (3, 4) are etched away to be flattened, whereby the semiconductor substrate (1) is exposed so that an interconnection (5) is formed on the remaining first and second oxide films (4).

22 Claims, 6 Drawing Sheets

FIG.5A        FIG.5B
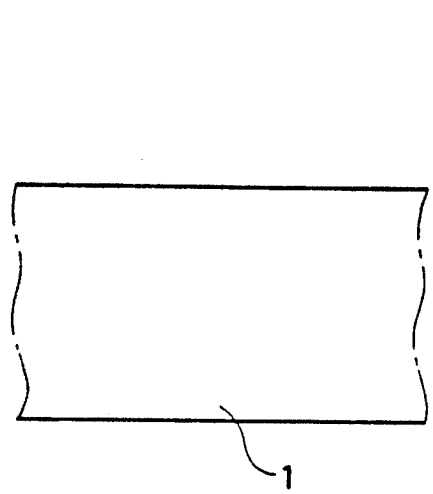
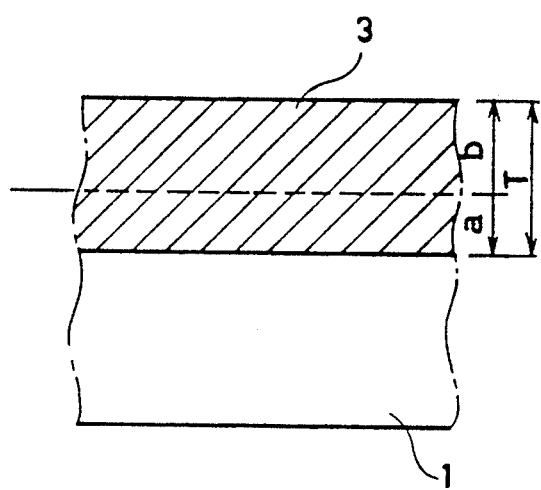
FIG.6
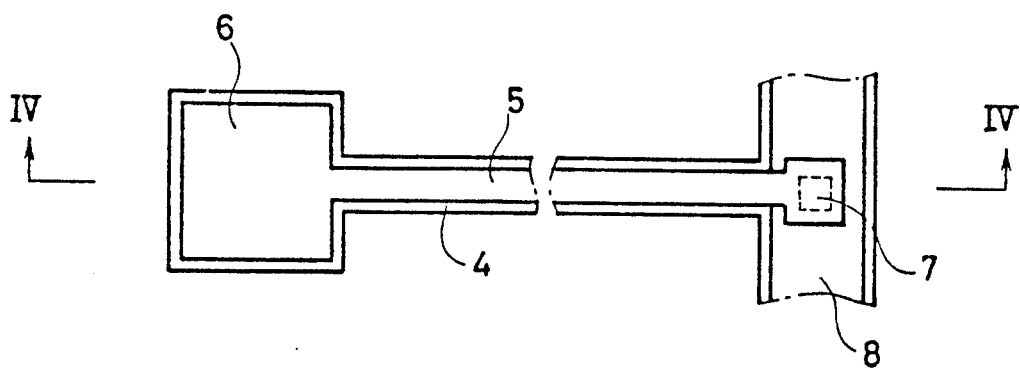
FIG.7
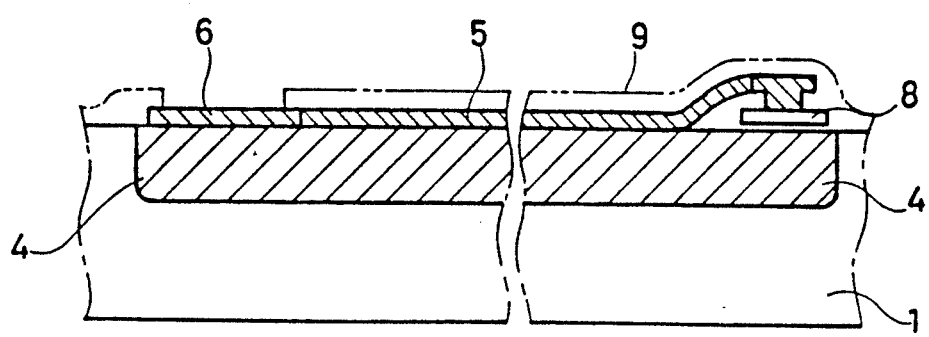

INTERCONNECTION LAYER FORMED ON EMBEDDED DIELECTRIC AND METHOD FOR MANUFACTURING THE SAME

BACKGROUND OF THE INVENTION

1. Field of the Invention

The present invention relates generally to an interconnection layer on a semiconductor substrate, and more particularly to structure for reducing parasitic capacitance of an interconnection layer on a semiconductor substrate and a method for manufacturing the same.

2. Description of the Prior Art

FIG. 1 is a diagram showing a plane layout of a memory portion of a dynamic MOSRAM (metal oxide semiconductor random access memory) with folded bit line structure.

In FIG. 1, the random access memory comprises active regions 14 for storing and transferring information charges, bit lines 11 each comprising a first aluminum interconnection layer electrically connected to the active regions 14 through contacts 7, cell plates 12 each serving as one electrode of a memory cell capacitor in which information charges are stored, and word lines 13 for controlling read/write operation of the information charges stored in the memory cell. A field oxide film is formed between the adjacent active regions, so that the adjacent active regions are electrically isolated from each other. More specifically, field oxide films are formed around the active regions 14. The cell plates 12 are formed outside regions enclosed by dash and dot lines, i.e., over the field oxide films. MOS transistors each having each of the word lines 13 serving as a gate electrode are formed in regions in which the cell plates 12 are not formed, so that the regions serve as transfer gates at the time of reading/writing signal charges. In the folded bit line structure as shown in FIG. 1, memory cells are connected to a single word line 13 every other bit line 11. More specifically, two bit lines constitute a bit line pair.

Description is now made on information reading operation by way of example.

When a single word line is selected, information stored in a memory cell connected to the word line 13 is read out to a bit line 11. In the conventional folded bit line structure, the potential difference between a bit line connected to the selected memory cell and a bit line referred to as complementary bit line hereinafter) connected to a non-selected memory cell, of a bit line pair is detected so that information is read out. More specifically, a reference potential appears on the complementary bit line and a potential corresponding to the information stored in the memory cell appears on the selected bit line. The difference between the potential on the bit line and the reference potential on the complementary bit line is increased so that information is read out. In general, when information is read out, an input signal is applied to a particular word line 13 as described above so that a transistor is operated, and charges stored in a memory cell are read out to a bit line 11 through a contact 7 and detected as the amount of change in potential, that is, an output signal in a sense amplifier (not shown) connected to the bit line 11. The effect of the input signal (generated by the transistor) on the output signal depending on the interconnection length of the bit line 11 from the contact 7 to the sense amplifier can not be neglected in an element which requires high-speed operation.

FIG. 2 is a diagram showing the relation associated with delay between the input signal and the output signal.

In FIG. 2, when the input signal is converted from a low level $V_L$ to a high level $V_H$, the corresponding output signal is converted from the low level $V_L$ to the high level $V_H$. As shown in FIG. 2, the output signal is not immediately converted from the low level $V_L$ to the high level $V_H$ but it is gradually converted from the low level $V_L$ to the high level $V_H$ after a lapse of a particular time period "t". More specifically, the input signal appears as an output signal delayed by the time period "t". Since the time delay "t" is proportional to a time constant ($R \times C$ = resistance × capacitance) of the bit line 11, the time constant must be decreased to increase the speed of an element. However, as the element is made finer and finer, an interconnection is made thinner and thinner or drawn about, so that the interconnection length tends to increase. As a result, the resistance R tends to rather increase.

On the other hand, the presence or absence of the output signal is detected as the amount of change in potential in the sense amplifier, as described above. Assuming that capacitance of a bit line is represented by $C_B$ and capacitance of a memory cell is represented by $C_S$, the amount of change in potential which appears on the bit line 11 is a very small value obtained by $C_S/C_B$. The capacitance $C_B$ of a bit line comprises capacitance of an interconnection of the bit line itself and stray capacitance which parasitizes the capacitance of an interconnection. If the stray capacitance is increased, that is, the capacitance $C_B$ of a bit line is increased, the amount of change in potential which appears on the bit line 11 is substantially decreased, so that it becomes difficult to correctly read out information.

As described in the foregoing, the decrease of the stray capacitance in interconnection structure is very important generally in terms of operating characteristics and for the purpose of correctly reading out the information in a random access memory or the like.

FIG. 3 is a schematic cross sectional view of interconnection structure for explaining stray capacitance of an interconnection.

In FIG. 3, a field oxide film 15 having a thickness "d" is formed on a silicon substrate 1, and an interconnection 5 having a width "W" is formed thereon.

Assuming that a dielectric constant of the oxide film 15 is represented by $\epsilon$ and the area of contact of the interconnection 5 with the oxide film 15 is represented by S, capacitance C produced by the interconnection 5 and the silicon substrate 1 is as follows:

$$C = \epsilon \times S/d.$$

Since the dielectric constant is a constant value determined by the oxide film 15, the area S must be decreased or the thickness d must be increased to decrease the capacitance C. Assuming that the interconnection length is represented by L, the relation is represented by the following equation;

$$S = L \times W$$

where L depends on the layout of elements. In order to decrease the area S, it is necessary to decrease the width W of the interconnection 5 so that the interconnection 5 has a rectangular cross sectional shape in FIG. 3. However, if the width W of the interconnection 5 is decreased with the area being held constant, the thickness of the interconnection layer to be processed becomes larger in patterning the interconnection 5, so that the processability is decreased. In addition, even if the interconnection 5 is made longer in a longitudinal direction so that capacitance between the interconnection 5 and the silicon substrate 1 can be decreased, another stray capacitance of an interconnection is produced between adjacent interconnections, so that it is not advisable to form the interconnection 5 in the above mentioned rectangular shape.

Thus, assuming that the interconnection length and the cross sectional shape of the interconnection 5 are not changed, the thickness of the oxide film 15 must be increased to decrease the capacitance C. However, the following problems occur to increase the thickness of the oxide film 15;

(1) A very long oxidizing time period is required to form a thick oxide film on the entire major surface of a semiconductor substrate.

(2) Since processing for oxidation at a high temperature is continued for a long time, characteristics of the semiconductor substrate change.

(3) When impurities are ion-implanted into the semiconductor substrate by fine structure processing of the thick oxide film in the subsequent processes, a mask or the like must be patterned on a substantial stepped portion because the oxide film is thick, so that it is difficult to form a pattern with high accuracy.

SUMMARY OF THE INVENTION

An object of the present invention is to provide improved interconnection structure on a semiconductor substrate and an improved method for manufacturing the same.

Another object of the present invention is to provide improved interconnection structure having a conventional cross sectional shape.

Still another object of the present invention is to provide improved interconnection structure in which the thickness of an oxide film on a semiconductor substrate is not increased.

Yet another object of the present invention is to provide improved interconnection structure in which stray capacitance of an interconnection can be reduced.

Yet still another object of the present invention is to provide improved interconnection structure in which an irregular and thick dielectric is not required on the surface of a semiconductor substrate.

A further object of the present invention is to provide a method for manufacturing improved interconnection structure in which the time required for forming an embedded oxide film of a semiconductor substrate is reduced.

A still further object of the present invention is to provide a method for manufacturing reliable and economic interconnection structure by reducing the effect on a semiconductor substrate at the time of oxidation.

In order to attain the above described objects, an interconnection layer interconnecting at least one component or terminal and at least another component or terminal on a semiconductor substrate according to the present invention widely comprises a trench having a predetermined shape formed in a major surface of the semiconductor substrate, a dielectric filling the trench and a conductive layer formed on the dielectric.

In accordance with another aspect of the present invention, an interconnection layer according to the present invention is formed in accordance with the steps of forming a trench having a predetermined shape on a major surface of the semiconductor substrate, thermally oxidizing the semiconductor substrate and filling the trench to form a first oxide film, and forming an electrically conductive layer on the first oxide film.

In accordance with still another aspect of the present invention, an interconnection layer according to the present invention is formed in accordance with the steps of forming in at least two rows trenches each having a predetermined shape on a major surface of a semiconductor substrate, thermally oxidizing the semiconductor substrate to form a first oxide film filling the trenches and to form a second oxide film in a region of the semiconductor substrate interposed between the trenches, and forming an electrically conductive layer on the first and second oxide films.

According to the present invention, since a dielectric is embedded in a trench and an interconnection is formed thereon, a thick dielectric is not required on a major surface of a semiconductor substrate, so that stray capacitance of the interconnection is decreased.

According to another aspect of the present invention, since a semiconductor substrate is thermally oxidized and a trench formed on a major surface of the semiconductor substrate is filled with an oxide film, an embedded oxide film can be easily formed in a predetermined range on the semiconductor substrate.

According to still another aspect of the present invention, since a semiconductor substrate having trenches formed in two rows on a major surface of the semiconductor substrate is thermally oxidized to form a first oxide film in the inside of the trenches and a second oxide film in a region of the semiconductor substrate interposed between the trenches, an embedded oxide film can be easily formed in a wide range on the semiconductor substrate in a short time.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B are diagrams corresponding to FIG. 4C, showing how an oxide film is formed in a silicon substrate by thermal oxidation;

FIG. 6 is a plan view showing an example applied to actual interconnection structure of the present invention, showing the positional relation between an interconnection and an embedded oxide film in a two-dimensional manner;

FIG. 7 is a cross sectional view taken along a line IV—IV shown in FIG. 6, showing the positional relation in a cross section of the interconnection and the embedded oxlde film.

DESCRIPTION OF THE PREFERRED EMBODIMENTS

Figure 1:
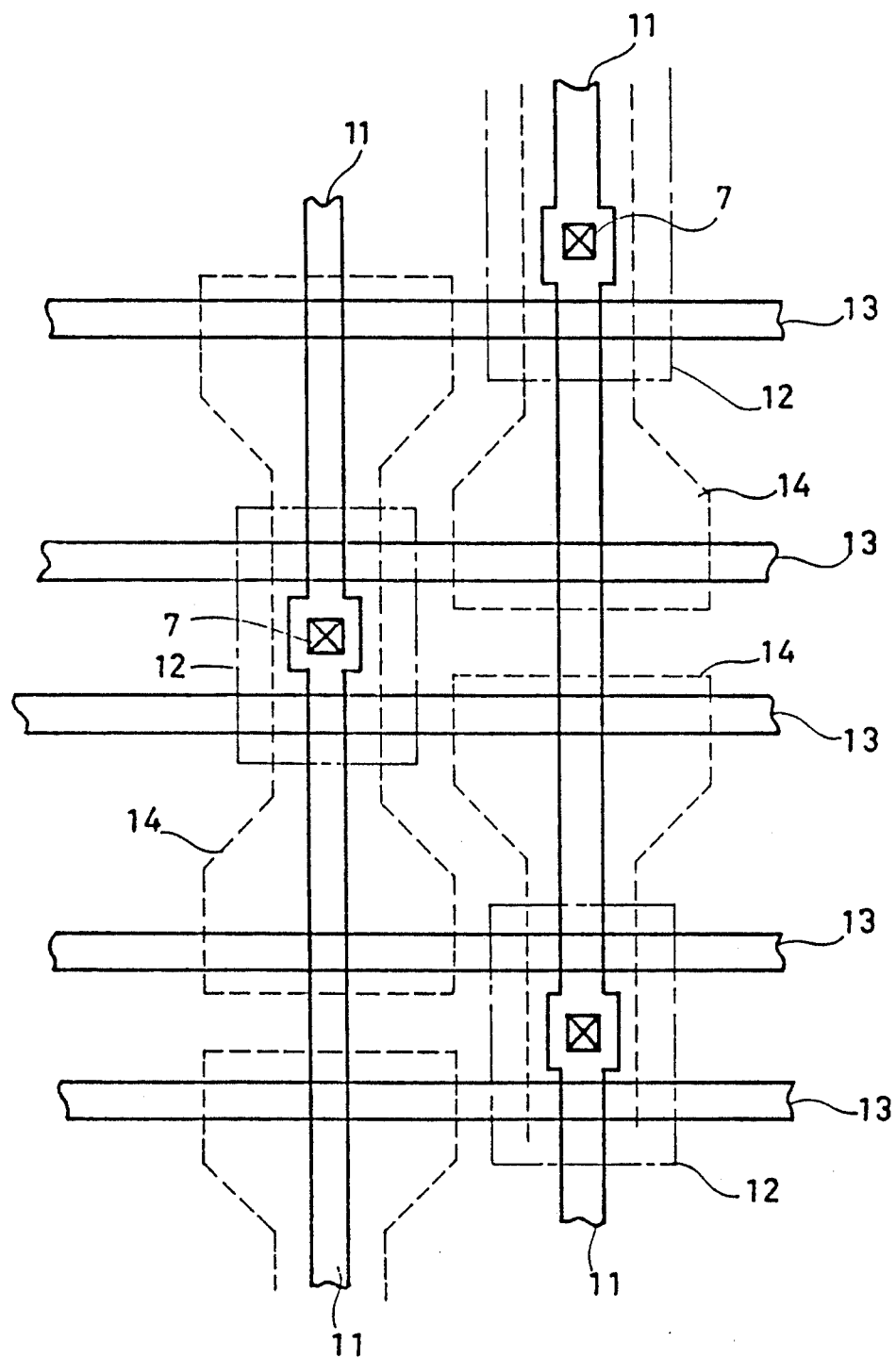
FIG. 1 is a diagram showing plane layout of a memory portion of a conventional dynamic RAM, showing typical layout of interconnection structure.
Figure 2:
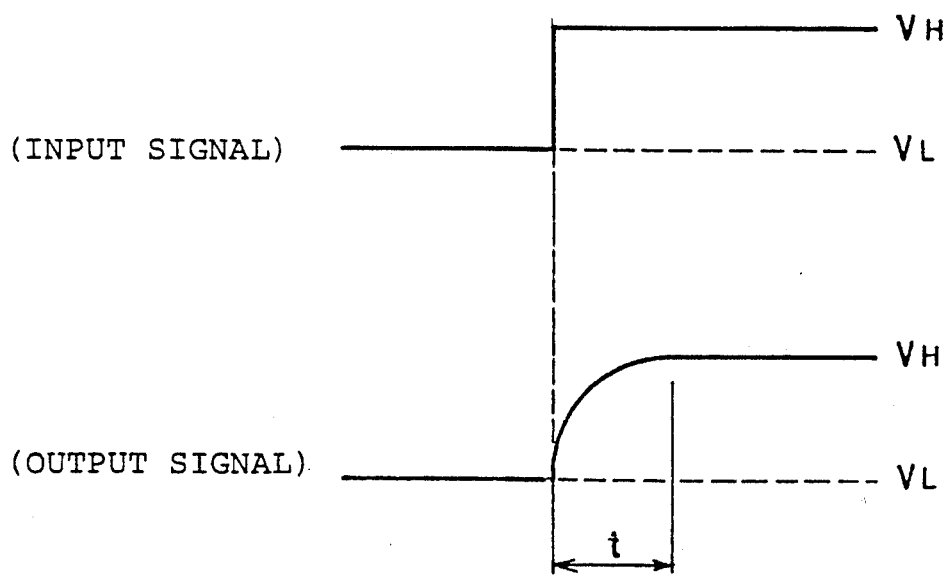
FIG. 2 is a diagram showing the relation associated with delay between an input signal and an output signal related to a general interconnection.
Figure 3:
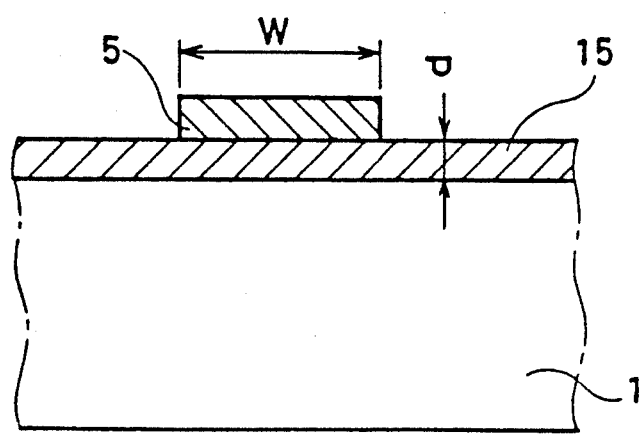
FIG. 3 is a cross sectional view showing conventional interconnection structure, showing an interconnection formed on an oxide film of a substrate.
Figure 4A:
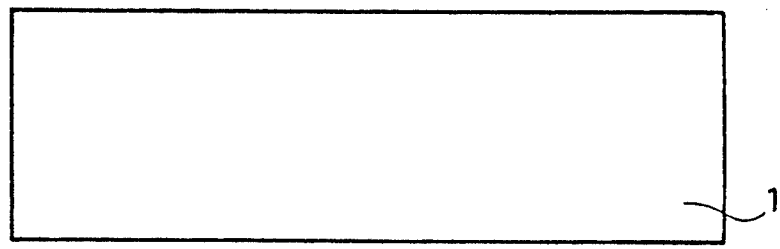
FIGS. 4A to 4E are diagrams of schematic processes showing a manufacturing method according to an embodiment of the present invention, where cross sections in main steps of the manufacturing method are illustrated with a substrate.
Figure 4B:
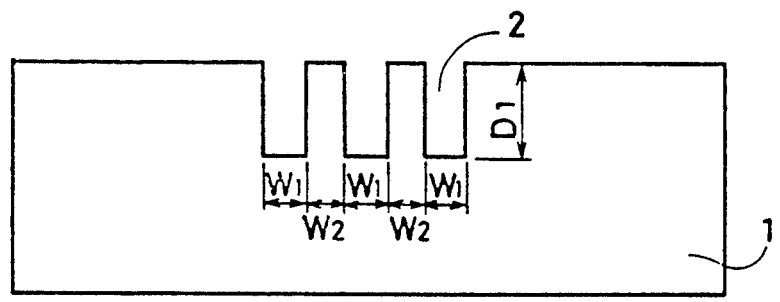
Figure 4C:
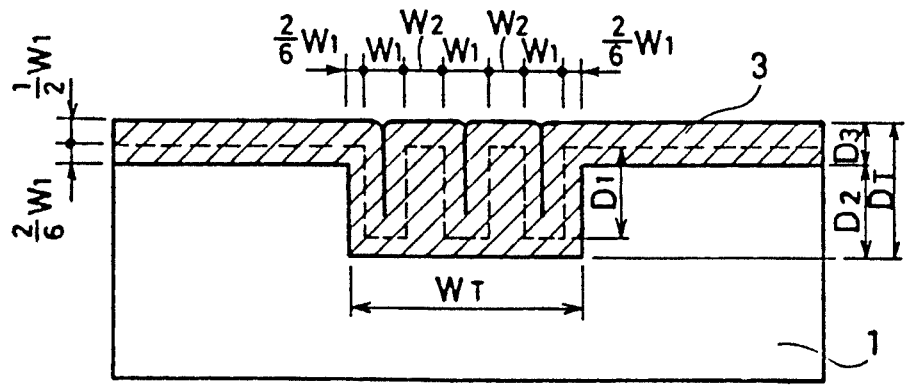

FIGS. 4A to 4E are cross sectional views of schematic processes showing a manufacturing method according to an embodiment of the present invention, and FIGS. 5A and 5B are diagrams corresponding to FIG. 4C, showing how an oxide film is formed in a silicon substrate by thermal oxidation.

Referring to the drawings, description is made on the manufacturing method.

A silicon substrate 1 having a major surface is prepared as shown in FIG. 4A and then, trenches 2 are formed in three rows in a predetermined position on the major surface by etching as shown in FIG. 4B. The trenches 2 are of the same size. It is assumed that the depth of the trenches 2 is represented by $D_1$ and the width thereof is represented by $W_1$, and the width between the trenches in the silicon substrate 1 is represented by $W_2$.

Then, the major surface of the semiconductor substrate 1 including the inside of the trenches 2 is thermally oxidized to form an oxide film 3, as shown in FIG. 4C. Referring to FIGS. 5A and 5B, description is made on the state in which the oxide film is formed.

When the major surface of the silicon substrate 1 is thermally oxidized to form an oxide film 3 having a thickness T on the major surface thereof, the oxide film 3 comprises a portion (having a thickness "a") which penetrates into the silicon substrate 1 and a portion (having a thickness "b") which expands on the silicon substrate 1. More specifically, oxygen in an atmosphere reacts with silicon on the surface of the semiconductor substrate 1 to generate $SiO_2$, the thickness of which becomes T (=a+b) as a whole. As a result, this means that an oxide film penetrates, by "a", into the substrate from the original surface of the substrate. The ratio of the thickness "a" to the thickness "b" is generally 4:6. The thermal oxidation is performed in the same manner as in the semiconductor substrate 1 inside the trenches 2. When it is assumed that the ratio of $W_1$ to $W_2$ is set to 6:4, an oxide film is formed inside the trenches 2 and regions between the trenches 2. According to the present embodiment, when the trenches 2 are formed in three rows, an oxide film 3 having a thickness $D_3$ is formed on the silicon substrate 1 and the oxide film 3 is formed in a trench having a width $W_T$ and a depth $D_2$ in the silicon substrate 1. Based on the above described thermal oxidation, there exists the following relations between the sizes:

$$W_T = 3 \times W_1 + 2 \times W_2 + W_1 \times 4/6$$

$$D_2 = D_1$$

$$D_3 = W_1/2 \times W_1 \times 2/6 = W_1 \times 5/6$$

In this case, it is important that the time required for oxidizing the oxide film in the trench having a width $W_T$ and a depth $D_2$ does not depend on the depth $D_2(=D_1)$ of the trench but depends on the thickness $D_3$ of the oxide film 3, i.e., the width $W_1$ of the trenches 2 and the width $W_2$ between the trenches 2 ($D_3 = (W_1+W_2)/2$). Thus, when it is desired to form an oxide film in a deeper trench, it is necessary only to form the trenches 2 deep. If the trenches have the identical width $W_1$, the oxidizing time is the same irrespective of the depth of the trench.

Furthermore, when it is desired to form an oxide film in a wider trench, it is necessary only to increase the number of trenches 2. If the spacing between additional trenches is identical to $W_2$, the oxidizing time is the same. This means that when it is desired to form an oxide film in trenches of the same size in a shorter time, it is necessary to decrease the width $W_1$ of the trenches 2 and keep the spacing $W_2$ between the trenches 2 in the relation $W_2 = W_1 \times 4/6$.

Figure 4D:
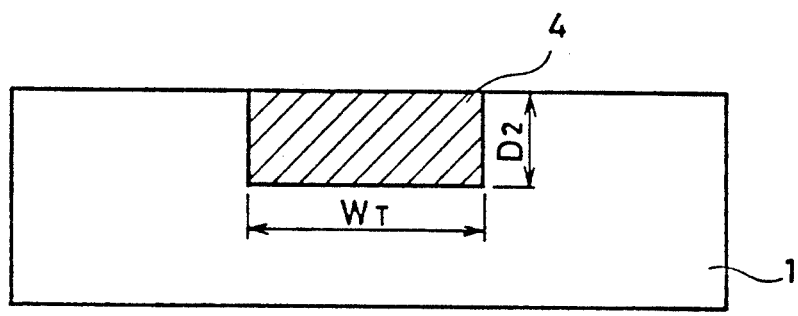

After the oxide film is formed, the layer of the surface thereof is etched away by the thickness $D_3$, so that the silicon substrate 1 is exposed. As shown in FIG. 4D, the embedded oxide film 4 having a width $W_T$ and a depth $D_2$ is formed in the silicon substrate 1. Since the depth $D_2$ of the embedded oxide film 4 equals $D_1$ of the trenches 2, the depth can be easily adjusted by forming the trenches 2 each having a desired depth.

Figure 4E:
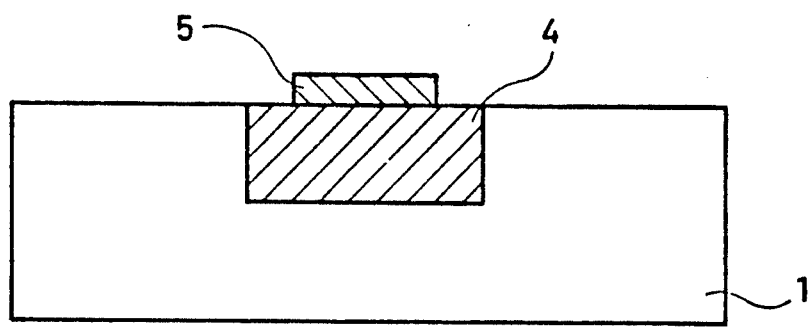

Finally, a film serving as an interconnection layer such as aluminum is formed on the entire major surface of the silicon substrate 1 including on the embedded oxide film 4 and then, patterned by using photolithographic techniques or the like, so that an interconnection 5 is formed on the embedded oxide film 4 as shown in FIG. 4E.

Although in the above described embodiment, trenches 2 are formed in three rows, generally the trenches 2 should correspond to the width of the interconnection 5. For example, trenches may be formed in a single row or a plurality of rows (other than three rows), even in which case the present invention can be applied. In general, it is desirable that there are trenches in approximately five columns on an interconnection in approximately 10μm width. If very fine processing of the trenches can be further performed, it is more advantageous because the larger the number of columns is with respect to a predetermined width, the shorter the time required for forming an oxide film becomes.

Furthermore, although in the above described embodiment, the respective trenches have the same shape, the trenches need not necessarily have the same shape, even in which case the present invention can be applied. More specifically, combinations of trenches having different depths and combinations of trenches having different cross sectional shapes may be employed, even in which case the present invention can be also applied.

In addition, although in the above described embodiment, an interconnecting material comprises aluminum, a refractory metal such as polysilicon may be employed, even in which case the same effect can be obtained.

Additionally, although in the above described embodiment, the surface of the oxide film 3 is etched so that the silicon substrate 1 is exposed, the surface may be used without etching or only a part of the surface may be etched away to flatten the upper surface thereof so that the silicon substrate 1 is not exposed, depending on elements.

FIG. 6 is a plan view showing an example applied to actual interconnection structure according to the present invention, and FIG. 7 is a cross sectional view taken along a line IV—IV shown in FIG. 6.

Referring now to FIGS. 6 and 7, description is made on the structure.

An interconnection 5 is formed on the major surface of a silicon substrate 1. The interconnection 5 has one end connected to a polysilicon electrode 8 which is connected to an internal circuit through a contact 7 and the other end connected to a bonding pad 6, so that the interconnection 5 is connected to the exterior. Since stray capacitance of the interconnection 5 is capacitance including capacitance of the bonding pad 6, an embedded oxide film 4 according to the present invention is formed in the silicon substrate 1 in the range under the interconnection 5 and the bonding pad 6 so that the stray capacitance is decreased. In addition, the surface of the interconnection 5 and a part of the bonding pad 6 are covered with a protective film 9 such as a nitride film, so that elements are protected.

Figure 8A:
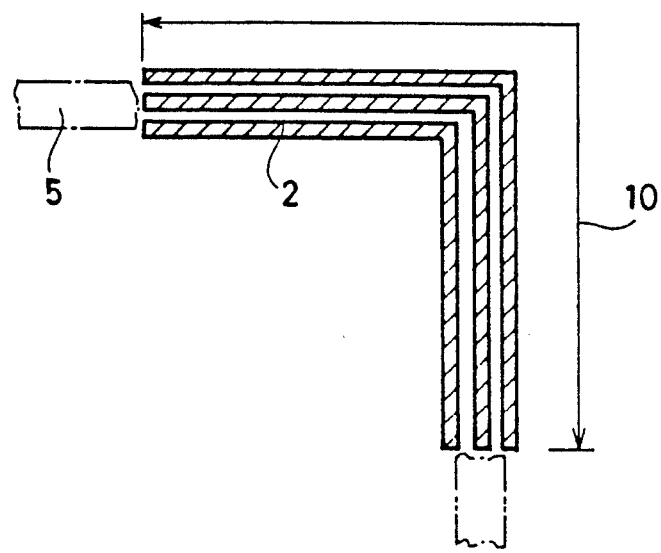
FIGS. 8A and 8B are diagrams showing the shape of a trench for forming an embedded oxide film according to the present invention, showing examples of a continuous trench and a discontinuous trench.
Figure 8B:
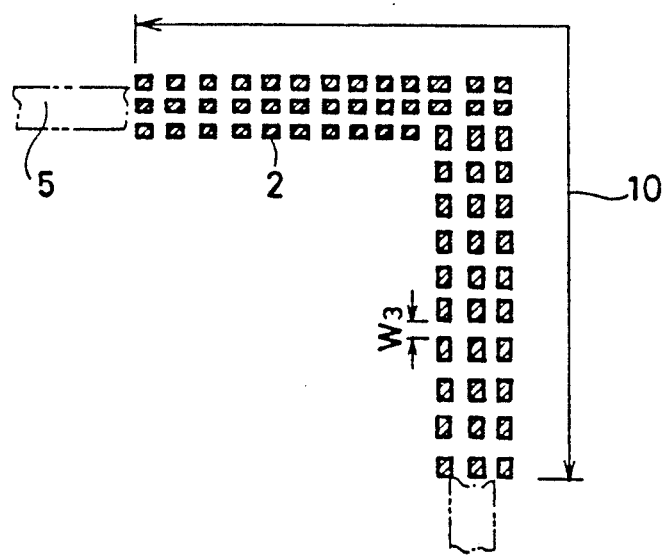

FIGS. 8A and 8B are plan views showing an example of a shape of a trench which is formed in a semiconductor substrate to form an embedded oxide film according to the present invention.

In FIG. 8A, elongate trenches 2 in the process shown in FIG. 4B are formed continuously in three rows in a region 10 in which an embedded oxide film is formed under a region in which the interconnection 5 is to be provided in the subsequent processes.

In FIG. 8B, elongate trenches 2 are not formed continuously in three rows but discontinuously, in the same region 10 in which an oxide film is formed, as in FIG. 8A. In this case, if the spacing $W_3$ between trenches in the direction in which the interconnection 5 is provided is the same as $W_2$ shown in FIG. 4B, an embedded oxide film formed by thermal oxidation is formed continuously in the region 10 in which an embedded oxide film is formed, as in FIG. 8A. In this case, since the final shape of the embedded oxide film is the same as that shown in FIG. 8A but the shape of the trench before oxidation is different from that shown in FIG. 8A and is not continuous, a semiconductor substrate is less affected, which is more advantageous in terms of the strength of the substrate.

As described in the foregoing, according to the embodiment of the present invention, since an interconnection is formed on a trench in which a dielectric is embedded, interconnection structure is obtained in which an irregular and thick dielectric is not required on a major surface of a semiconductor substrate so that stray capacitance of the interconnection can be decreased.

Furthermore, according to the embodiment of the present invention, since the trench formed in the major surface of the semiconductor substrate is thermally oxidized as described above, a method for manufacturing an interconnection layer capable of easily forming an embedded oxide film in a predetermined position in a short time is obtained.

In addition, according to the embodiment of the present invention, since trenches formed in at least two rows in the major surface of the semiconductor substrate is thermally oxidized as described above, a method for manufacturing an interconnection layer capable of easily forming an embedded oxide film over a wide range in a short time is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection between at least one component or terminal and at least another component or terminal on a semiconductor substrate, the interconnection formed in accordance with the following steps:

forming at least two rows of trenches each having a predetermined shape on a major surface of said semiconductor substate, said trenches having a predetermined depth, thermally oxidizing a portion of said semiconductor substrate including said trenches and a region of said semiconductor substrate between said trenches to completely oxidize said region of said semiconductor substrate between said trenches and to form an oxide film filling said trenches, thereby completely oxidizing said portion of said semiconductor substrate to the depth of said trenches, and forming an electrically conductive layer on said dielectric, said electrically conductive layer forming said interconnection between said at least one component or terminal and said at least another component or terminal.

2. The interconnection of claim 1, wherein said trenches are filled to the level of the major surface of said substrate and said conductive layer is formed at the level of the major surface of said substrate.

3. The interconnection of claim 2, wherein the trenches are filled only to the level of the major surface of the substrate.

4. The interconnection of claim 1, wherein said semiconductor substrate comprises a silicon substrate.

5. The interconnection of claim 1, wherein said dielectric comprises an oxide film.

6. The interconnection layer of claim 1, wherein said conductive layer comprises aluminum.

7. The interconnection layer of claim 1, wherein said conductive layer comprises a refractory metal.

8. The interconnection of claim 7, wherein said refractory metal comprises polysilicon.

9. The interconnection layer of claim 1, wherein each of said trenches has a rectangular cross sectional shape.

10. The interconnection of claim 1, further comprising an oxide film on the major surface of said semiconductor substrate excluding said trenches and the region of said semiconductor substrate interposed between said trenches.

11. The interconnection of claim 1, wherein said trenches comprise a first trench and a second trench, in which the widths of said first and second trenches are the same.

12. The interconnection of claim 11, wherein the steps of forming said interconnection include the further step of predetermining a width of said first and second trenches and of the region interposed therebetween, wherein the width of said first and second trenches and a width of the region of said semiconductor substrate interposed between said first trench and said second trench are selected to have a constant ratio, said constant ratio being based on a ratio of the thickness of a segment in which an oxide film expands on the semiconductor substrate to the thickness of a portion in which the oxide film penetrates into the semiconductor substrate by thermal oxidation.

13. The interconnection of claim 12, wherein said constant ratio of the trench width to the interposed region width is 6 to 4.

14. The interconnection of claim 1, wherein said trenches are formed by etching.

15. The interconnection of claim 1, wherein said electrically conductive layer comprises a bonding pad.

16. A method of manufacturing an interconnection on a semiconductor substrate comprising the following steps:

forming at least two rows trenches each having a predetermined shape on a major surface of said semiconductor substrate, said trenches having a predetermined depth.

thermally oxidizing a portion of said semiconductor substrate including said trenches and a region of said semiconductor substrate between said trenches to completely oxidize said region of said semiconductor substrate between said trenches and to form an oxide film filling said trenches, thereby completely oxidizing said portion of said semiconductor substate to the depth of said trenches, and forming an electrically conductive layer on said dielectric, said electrically conductive layer forming said interconnection between said at least one component or terminal and said at least another component or terminal.

17. A method of manufacturing an interconnection on a semiconductor substrate as in claim 16, wherein the step of thermally oxidizing said portion of said semiconductor substrate comprises the step of:

thermally oxidizing said semiconductor substrate to form a first oxide film filling said trenches and to form a second oxide film in said region of said semiconductor substrate interposed between said trenches.

18. The method of claim 17, which further comprises a step of flattening the upper surfaces of said first, second and third oxide films.

19. The method of claim 18, wherein said flattening step comprises the step of etching away the upper surfaces of said first, second and third oxide films to a predetermined thickness, so that said semiconductor substrate covered with said third oxide film is exposed.

20. A method of manufacturing an interconnection on a semiconductor substrate as in claim 17, further comprising the step of forming a third oxide film on the major surface of said semiconductor substrate but excluding the area of said trenches and the region interposed between said trenches.

21. The method of claim 16, comprising the further steps of predetermining a width of said first and second trenches and of the region interposed therebetween, wherein the width of said first and second trenches and a width of the region of said semiconductor substrate interposed between said first trench and said second trench are selected to have a constant ratio, said constant ratio being based on a ratio of the thickness of a segment in which an oxide film expands on the semiconductor substrate to the thickness of a portion in which the oxide film penetrates into the semiconductor substrate by thermal oxidation.

22. The method of claim 21, wherein said constant ratio of the trench width to the interposed region width is 6 to 4.

* * * * *